United States Patent [19]

Parent

[11] 4,054,500
[45] Oct. 18, 1977

[54] METHOD OF MAKING REFRACTORY METAL-CERAMIC CRUCIBLE

[75] Inventor: Edward D. Parent, Hamilton, Mass.

[73] Assignee: GTE Sylvania Incorporated, Danvers, Mass.

[21] Appl. No.: 572,369

[22] Filed: Apr. 28, 1975

[51] Int. Cl.² .................. C25D 13/02; C25D 13/12
[52] U.S. Cl. .................................................. 204/181
[58] Field of Search ................................... 204/181

[56] References Cited

U.S. PATENT DOCUMENTS 2,734,857  2/1956  Snyder ........................... 204/181

Primary Examiner—Howard S. Williams
Attorney, Agent, or Firm—James Theodosopoulos

[57] ABSTRACT

A crucible for containing metal to be evaporated for vacuum deposition is manufactured by winding refractory metal wire into the shape of a helical basket coil. The coil is electrophoretically coated with a primer coat of alumina and is then flame or plasma sprayed with alumina to form the crucible.

2 Claims, 2 Drawing Figures

METHOD OF MAKING REFRACTORY METAL-CERAMIC CRUCIBLE

THE INVENTION

In the metallizing industry there is a need for vacuum evaporation sources that are resistant to erosion from molten metal. A commonly used source is in the form of an integral refractory metal metal-ceramic crucible. In this evaporation sources a conical helix of refractory wire, such as tungsten, is coated with sufficient ceramic material, such as alumina, to cover all the metal and to form a crucible suitable for the containment of a charge of molten metal to be evaporated.

In the usual method of manufacture, a tungsten wire basket coil is first grit blasted to roughen the wire surface and is then flame sprayed or plasma sprayed with alumina to form the coated wire crucible. There are two disadvantages to this method of making such crucibles.

First, a tungsten oxide layer forms on the exposed wire surface, prior to alumina deposition thereon, as a result of the heat from the alumina spraying operation. This tungsten oxide layer shortens the life of the crucible in the following manner. During operation of the crucible, the tungsten oxide forms a eutectic, at 1254° C, with the overlaying alumina. The lighter molten eutectic migrates upward toward the melt while the heavier molten metal migrates downward toward the wire where it can react with the tungsten.

Second, the process of flame spraying or plasma spraying is not sufficiently directional to coat the inside apex of the wire basket without forming an excessive buildup on the upper, more accessible parts of the wire basket.

It is an object of this invention to provide a refractory metal-ceramic crucible that overcomes the disadvantages of the prior art crucibles.

In this invention a thin primer coat of alumina is applied to the wire basket coil by electrophoretic deposition prior to the step of spraying a heavier alumina buildup thereon. This insulating layer protects the wire from oxidation when the hot plasma or flame spray is applied. Such a primer coat also eliminates the need for roughening the wire surface. The alumina coating is applied electrophoretically at room temperature and the coated coil is then heated in a reducing atmosphere of about 1600° to 1700° C to sinter the coating. A heavy buildup of flame sprayed or plasma sprayed alumina is then applied.

Figure 1:
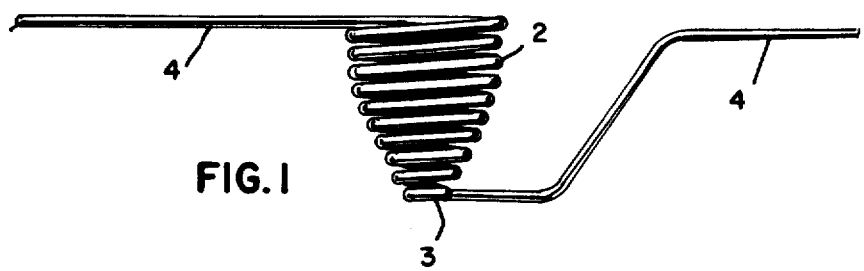
FIG. 1 is a view of a refractory metal wire basket coil prior to deposition of the ceramic thereon.
Figure 2:
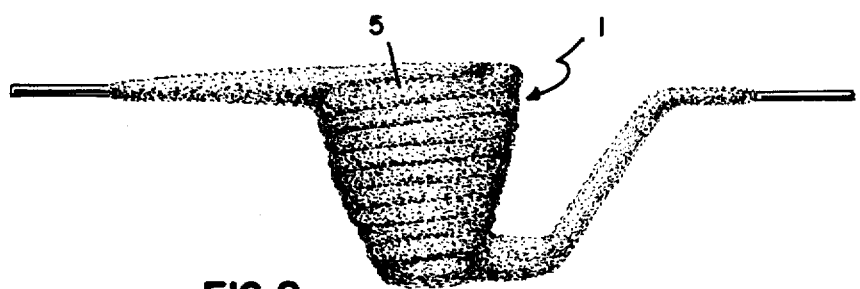
FIG. 2 shows a completed crucible, formed by coating the basket coil of FIG. 1.

A refractory metal-ceramic crucible 1 in accordance with this invention was made by winding 50 ml tungsten wire into a helical basket coil 2 as shown in FIG. 1. Coil 2 had a height of about ⅜inch and consisted of 12 turns varying from a diameter (inside) of 7/16 inch at the top to about 50 mils at the bottom or apex 3. The coil had two oppositely extending legs 4, each about 1⅜inches long, to provide for mechanical and electrical connection of the crucible during operation within a vacuum deposition chamber.

The bare coil was electrophoretically coated with a 2-4 mil thick primer coat of alumina using the method shown in U.S. Pat. No. 2,966,449 the disclosure of which is incorporated herein by reference. It was then fired in a hydrogen atmosphere for about 10 minutes at 1675° C. The step of electrophoretically coating a primer coat of alumina provides two improvements. First, it prevents formation of tungsten oxide on the wire surface when the coil is flame sprayed or plasma sprayed and, second, due to the highly directional characteristics of electrophoretic deposition, the inner apex of the coil is adequately coated.

Next, alumina was flame sprayed on the primer coated coil to a buildup sufficient to close off the space between turns and to form a crucible that could contain molten metal. The thickness of flame sprayed alumina 5 averaged about 30 mils on the body of the coil. The ends of legs 4 were left bare to permit electrical connection during use.

Crucibles in accordance with this invention together with crucibles which did not have the electrophoretically deposited primer coat were used in the vacuum deposition of nickel metal. The evaporation temperature of nickel was about 1530° to 1600° and the crucibles required about 35 amperes at 5 volts to evaporate the nickel. The crucibles in accordance with this invention had about double the life of the crucibles without said primer coat.

I claim:

1. A method of making a refractory metal-ceramic crucible comprising the steps of winding refractory metal wire into the shape of a helical basket coil, electrophoretically coating the coil with a primer coat of alumina, firing the primer coat, and flame spraying or plasma spraying sufficient alumina on the primer coated coil to form a crucible capable of containing molten metal.

2. The method of claim 1 wherein the helical basket coil is wound of tungsten wire.

* * * * *